United States Patent [19]
Bowers

[11] Patent Number: 4,638,483
[45] Date of Patent: Jan. 20, 1987

[54] HIGH SPEED INTENSITY MODULATED LIGHT SOURCE

[75] Inventor: John E. Bowers, East Brunswick, N.J.

[73] Assignee: AT&T Bell Laboratories, Murray Hill, N.J.

[21] Appl. No.: 635,754

[22] Filed: Jul. 30, 1984

[51] Int. Cl.$^4$ .............................................. H01S 3/10
[52] U.S. Cl. ..................................... 372/26; 372/28; 372/32; 372/43
[58] Field of Search ....................... 372/28, 26, 29–32, 372/43, 44, 45

[56] References Cited
U.S. PATENT DOCUMENTS
3,469,922 9/1969 Coccoli et al. ........................ 372/55

OTHER PUBLICATIONS

Osterwalder et al; "Freq. Modulation of GaAlAs Injection Lasers or Microwave Freq. Rates"; IEEE JQE, vol. QE-16, No. 3, Mar. 3, 1980.
Jackson et al; "Measurement of Small Phase Shifts Using a Single-Mode Optical Fiber Inter."; Opt. Lett., vol. 5, No. 4, Apr. 1980.

Primary Examiner—Leon Scott, Jr.
Attorney, Agent, or Firm—Richard D. Laumann

[57] ABSTRACT

A semiconductor laser is frequency modulated and the output is put through an FM to IM converter. Intensity modulation is obtained at high frequency with the use of low switching current and minimal chirping oscillations.

9 Claims, 6 Drawing Figures

HIGH SPEED INTENSITY MODULATED LIGHT SOURCE

TECHNICAL FIELD

This invention relates generally to light sources and particularly to high speed, intensity modulated coherent light sources.

BACKGROUND OF THE INVENTION

Optical communications systems are presently of commercial importance because of their large information carrying capacity. Optical communications systems as presently contemplated have a light source and a photodetector which are optically coupled to each other by means of a glass transmission line which is commonly referred to as an optical fiber. Systems presently in use carry information at rates in excess of 100 Mbit/sec and it is contemplated that future systems will carry information at rates geater than 1 Gbit/sec.

For highest transmission rates and longest distances between light source and photodetector, the light source presently preferred by those skilled in the art is a semiconductor laser diode. These diodes are relatively compact and can emit radiation with a relatively narrow spectral width in the wavelength regions presently of greatest interest. Diodes can now be fabricated having both single transverse and single longitudinal mode output. Such diodes are commonly referred to as single frequency lasers and are desirable in many applications because they, for example, maximize light coupled into the fiber and minimize deleterious aspects of the fiber dispersion characteristics. These characteristics may broaden the light pulse and thus limit the attainable bit rate and distance between source and detector. If either the bit rate of the distance between source and photodetector become too great, adjacent light pulses will overlap because of fiber dispersion and information is lost. Although a variety of modulation techniques has been proposed, present systems use intensity modulation (IM) of the laser output to convey information. That is, information is conveyed by variations in the intensity of the light output from the laser.

However, other modulation techniques offer specific advantages over intensity modulation. For example, higher frequency modulation is possible with frequency modulation (FM) than with IM for at least two reasons. First, the combination of the inherent FM or IM response with the RC parasitics results in a more efficient high frequency response with FM than with IM. Second, the rolloff above resonance is slower for FM than for IM.

Moreover, direct intensity modulation of a semiconductor laser becomes increasingly difficult as the bit rate increases, i.e., as the frequency increases. Direct intensity modulation means that the intensity of the light output is varied by varying the current through the laser. This type of modulation has at least three problems which become more significant at high bit rates. First, current modulation causes frequency modulation of the semiconductor laser diode which broadens the spectral width of the emitted radiation. This effect is commonly termed chirping and may be as large as, for example, 5 Angstroms. Chirping is often undesirable because of the dispersive properties of the fiber. Second, to intensity modulate the laser, a large amount of current, typically 20 mA or more, must be rapidly switched and this switching becomes more difficult as the frequency increases. Third, many single frequency lasers, such as the cleaved coupled cavity and external cavity lasers, cannot be fully intensity modulated with ease because of laser mode hopping, i.e., the laser output shifts from one longitudinal mode to another. This is commonly termed the "extinction penalty."

Because of these reasons, alternatives to direct intensity modulation have been considered. One alternative commonly contemplated today is the use of an external modulator which might be, for example, an integrated optic modulator. The laser emits radiation continuously and the desired intensity modulation is supplied by singnals to the modulator which vary light absorption within the modulator. However, high voltages, typically greater than 10 volts, are often required for efficient operation of the external modulators presently contemplated at high frequencies. The voltages required generally increase as the frequency increases. Additionally, there is also the problem of obtaining simple, efficient, high speed modulators. Finally, there is the additional problem of signal loss resulting from the coupling between the laser and modulator as well as between the modulator and the fiber.

Yet another approach uses coherent optical techniques which require locking two oscillators together, i.e., the two oscillators must be at the same frequency. While high sensitivity is obtained, locking the oscillators together may be difficult as they may be more than 100 km apart.

SUMMARY OF THE INVENTION

A light source, comprising a source of radiation such as a semiconductor laser diode, may be intensity modulated with means for frequency modulating the source of radiation to yield frequency modulated beam and with means for delaying a first portion of said beam with respect to a second portion of said beam and recombining said portions thereby producing intensity modulation of the output from the light source. The means for delaying may comprise means for splitting the frequency modulated beam into two unequal path lengths by using, for example, a Michelson or Mach-Zehnder interferometer. In another embodiment, the means comprises a fiber optic recirculating loop.

For reasons of clarity, the elements of devices according to this invention are not drawn to scale in the Figures.

DETAILED DESCRIPTION

Figure 1:
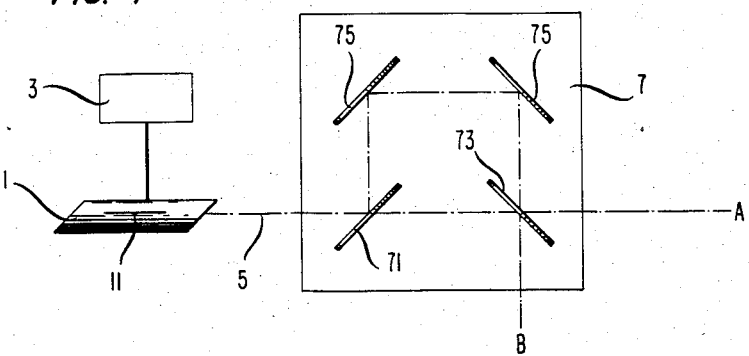
FIG. 1 is a schematic representation of an intensity modulated light source according to this invention.

One embodiment of an intensity modulated light source, using a semiconductor laser diode, according to this invention is schematically depicted in FIG. 1. The light source comprises semiconductor laser diode 1 and means 3 for frequency modulating said diode. Means 3 includes both the bias and modulator currents. The modulation current is varied to obtain the desired frequency modulation. The laser diode has an active region 11 in which electrons and holes recombine radiatively. The frequency modulated beam from the laser is indicated as 5 and is incident upon means 7 for delaying a first portion of the beam with respect to a second portion of the beam and recombining the first and second portions. In the embodiment depicted, this means comprises beam splitter 71 which transmits a first portion of the beam to a second beam splitter 73 and reflects a second portion of the beam to reflector 75 which directs the second portion of the beam to said second beam splitter 73. The two portions recombine at the second beam splitter to form two output beams. One output beam exits from port A and the other output beam exits from port B. As is evident, the output light beams exiting from both ports A and B comprise portions which have traveled different path lengths, i.e., one portion of the beam has been delayed with respect to the other portion of the beam.

The various path lengths may be adjusted by any of several techniques. For example, reflector 75 may be moved with respect to the beam splitters 71 and 73. Additionally, the path lengths may be adjusted by varying the refractive index along the path length. Adjustment of the relative path lengths permit desired interferences to be obtained at beam splitter 73, i.e., at the output ports.

In operation, constructive or destructive interference is obtained at beam splitter 73 by changing the laser frequency from a first value to a second value. The two frequencies, together with the path lengths, are selected so that the output at the ports goes from a minimum to a maximum, or vice versa, as the frequency is changed. It may be desirable to adjust the path lengths for other reasons, such as the desire to maintain the maxima and minima, i.e., one and zeros, at the same intensity levels.

The laser should be a single longitudinal mode laser, i.e., it should be a single frequency laser. Multiple longitudinal mode output is not desirable because the output beam must interfere with itself; either constructively or destructively, at the exit ports and this is not easily achieved with multiple mode output. The laser should also operate with only a single transverse mode. Single frequency lasers are now well known to those skilled in the art and therefore need not be described in detail. Distributed feedback lasers or coupled cavity systems, such as a cleaved coupled cavity laser, may be used.

Means for frequency modulating semiconductor injection lasers are also known to those skilled in the art. See, for example, *IEEE Journal of Quantum Electronics*, QE-16, pp. 250–252, March, 1980 or *Electronics Letters*, 18, pp. 302–304, Apr. 1, 1982. Frequency modulation is obtained by varying the injected current and thereby varying the optical path length of the cavity. Of course, the magnitude of the frequency shift will depend upon the magnitude of the change in injection currents.

The magnitude of the frequency modulation required for the desired intensity modulation may be determined by the following considerations which will be discussed by reference to FIG. 2. The laser frequency is plotted horizontally in arbitrary units versus the output power vertically, also in arbitrary units, in FIG. 2. The transfer characteristics are depicted separately for ports A and B by the solid and dashed lines, respectively. The precise nature of curves in an actual light source will depend upon the actual path lengths the beam travels, i.e., changing the relative path lengths will change the frequencies at which the maximum and minimum intensities occur.

The actual transfer characteristics obtained will depend upon how the power is split by the beam splitter. If the beam is not split into two portions of equal intensity, the output power minima will be nonzero as depicted. It is generally preferred that the splitting be equal as this will result in the longest ratio of maximum power to minimum power as the frequency shifts. It will also be appreciated by those skilled in the art that the polarization states of the beam and its portions should be preserved. The shape of the transfer characteristics may be more complex as the laser may exhibit some residual intensity modulation.

Figure 2:
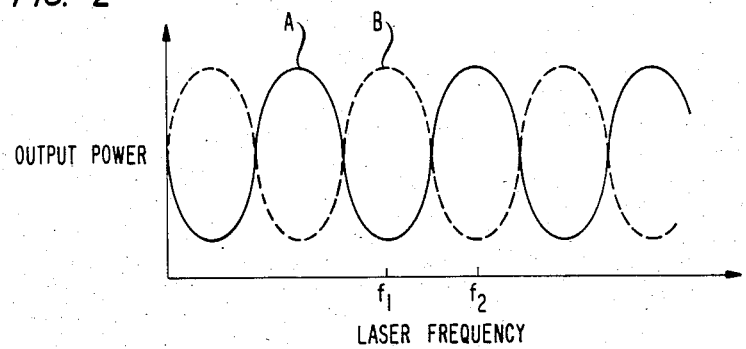
FIG. 2 plots the laser frequency horizontally versus the output power vertically for ports A and B of the light source depicted in FIG. 1.

As is evident from FIG. 2, a change in the laser frequency from $f_1$ to $f_2$ results in a change in the output power at both ports as the two portions of the beam recombine to interfere either constructively or destructively. As will be shown, a small change in the frequency can result in a large change in amplitude, i.e., the difference between $f_1$ and $f_2$ may be small. The desired transfer characteristics are maintained by, for example, changing the dc bias current, i.e., $f_1$ and $f_2$ may vary during operation as a result of temperature changes in the light source, laser aging, etc.

The desired intensity modulation is now obtained when the frequency of the laser is changed from the frequency $f_1$ to a frequency $f_2$ with the output power from port A being a minimum and a maximum at the two frequencies, respectively. The output power from port B is a maximum and a minimum at $f_1$ and $f_2$, respectively. It will be readily appreciated that high speed frequency modulation thus leads to high speed intensity modulation. The desired intensity modulation requires that the laser frequency change by an amount $\Delta\omega T = \pi$ where $\Delta\omega$ is the change in laser frequency, T is the relative delay between the two portions and $\pi$ is the phase change. The delay, T, is desirably the rise time of the output pulse and $\frac{1}{2}T$ must therefore be greater than the bit rate. The delay must obviously be less than the pulse duration. As T becomes smaller, a larger frequency excursion $\Delta\omega$ must be used although smaller devices may be fabricated and higher bit rates may be obtained.

The amount of current modulation needed to obtain this frequency excursion is typically relatively small as shown by an illustrative example. For a 2 Gbit/sec system with T=1.0 nsec, the length of the delay in a glass fiber must be approximately 20 cm. For InGaAsP lasers, a typical rate of frequency change with respect to current is 1 GHz/mA. A frequency shift of 2 GHz is thus required and, the current must be changed by approximately 2.0 mA. It should be noted that this current change is approximately one to three orders of magnitude smaller than the equivalent current change needed to amplitude modulate an InGaAsP laser diode. Comparable rates of frequency change with respect to current are obtained with AlGaAs lasers operating at shorter wavelengths near 0.9 μm.

The maximum obtainable bit rate is determined by the maximum frequency modulation of the laser. At high modulation rates, the frequency modulation is due primarily to the carrier density induced index changes in the laser. At low modulation rates, the frequency modulation results from a thermally induced change in refractive index in addition to the carrier density induced index change. The maximum obtainable frequency thus depends upon both the laser structure and its composition. General considerations have indicated that an upper limit greater than 15 GHz should be attainable in double heterostructure junction lasers.

Figure 3:
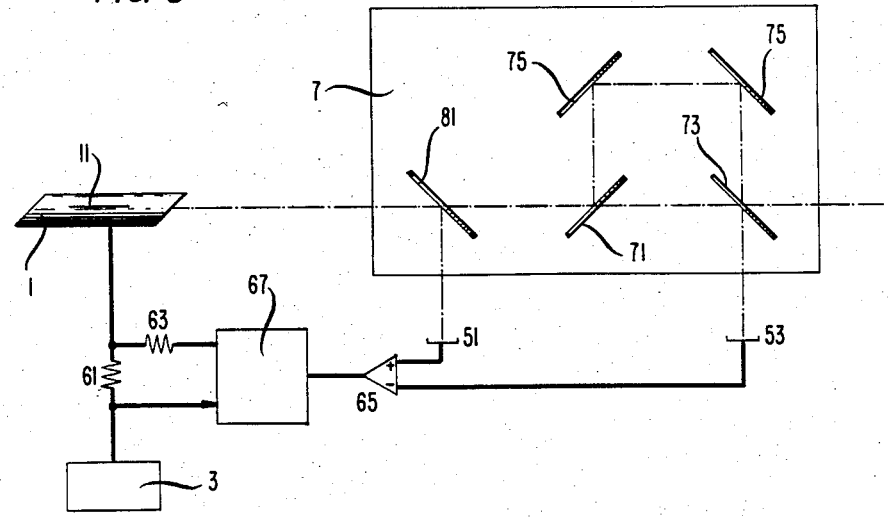
FIG. 3 is a schematic representation of a feedback stabilization scheme for use with an intensity modulated semiconductor light source according to this invention using a frequency modulated semiconductor laser.

The laser frequency, $\omega$, and the path length, T, must be stabilized so that a zero output remains a zero output. In other words, the stability must satisfy the following relationship $d(\omega T) = d\omega T + \omega dT < q\pi$ where q is a quality factor. If a logical zero is anything less than 10 percent of the logical one, then the quality factor equals 0.1. Quality factors are similarly determined for other ratios of logical ones and zeros. It is also desirable to stabilize the laser at a constant power level, i.e., the output power for a logical one does not vary. The desired stability may be easily achieved by feeding a signal derived from the detected output back to the laser current drive. Such a circuit is schematically depicted in FIG. 3. Numerals identical to those used in FIG. 1 refer to identical elements. The feedback circuit comprises two photodetectors 51 and 53 which receive light from beam splitters 81 and 73, respectively. The output from the photodetectors goes to amplifier 65. A latch 67 is present which is connected to amplifier 65 and means 3. The latch is present so that a comparison is made only when a logical zero is transmitted, i.e., when power is received at photodetector 51. The connection from means 3 to the latch provides this information. The differential amplifier provides an error signal. Connections are made to laser 1 through resistances 61 and 63 from means 3 and latch 67, respectively.

To obtain the desired feedback signal, the logical one is not at the peak of the output signal as depicted in FIG. 2, but at a somewhat smaller value where the first derivative of the transfer characteristic is nonzero. This enables the bias current to be shifted in the correct direction if a change is required. This value is compared to a signal proportional to the laser output intensity, and the difference is sent back to the laser current drive. The circuit thus has means for monitoring the outputs of the light source and laser, comparing the outputs, and means for adjusting the bias current to the laser. The latch is added in the embodiment depicted because the comparison is valid only when a logical zero is transmitted and a logical one goes to the feedback detector. It should be noted that photodetector 53 receives the complement of the output. Hence, the comparison is made when a logical zero is transmitted.

Modifications of the stabilization circuit will be readily thought of. Photodetector 51 provides means for measuring the maximum power output and may be positioned to measure the intensity of the radiation emitted from the rear face of the laser. Additionally, the dc bias current could be in latch 67 rather than means 3.

It should be noted that the stabilization circuit simply insures that $\omega T$ is a multiple of $\pi$. The system is not stabilized to keep the difference between the ON and OFF states constant. This is not necessary because $\Delta \omega$ is approximately $10^9$ Hz while $\omega$ is approximately $10^{14}$ Hz and the problem is much more severe for the latter case. In fact, the modulation current source must be stabilized to only approximately 0.1 mA.

Figure 4:
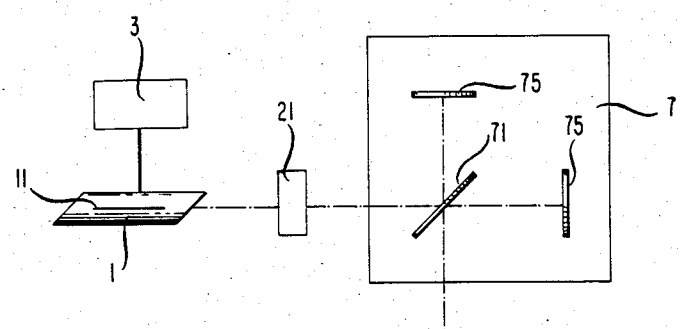
FIGS. 4-6 are schematic representations of further embodiments of this invention.

Other configurations for means 7 are contemplated in addition to the interferometer already described using two bulk optic beam splitters. One configuration for means 7 is depicted in FIG. 4 which uses only a single beam splitter 71, that is, it is an unbalanced Michelson interferometer. The two portions of the beam are split and then recombined at beam splitter 71. There is also only a single output port. This embodiment suffers an apparent disadvantage in that an additional component, isolator 21, is advantageously added between the laser and interferometer. Isolators are well known in the art and need not be described in detail.

Figure 5:
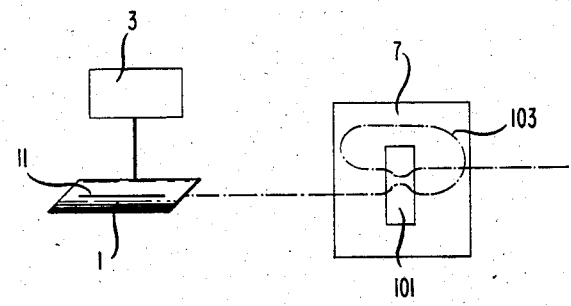

Several embodiments for means 7 using fiber optics are contemplated. One embodiment is depicted in FIG. 5 and uses a fiber optic recirculating loop 103 together with a directional coupler 101. The directional coupler splits the incoming beam and sends a first portion through loop 103 while the second portion passes directly through the coupler. The coupler is ideally a 3 db coupler, i.e., it splits the beam into two portions of equal intensity. Directional couplers, as well as fiber optic loops, are well known to those skilled in the art and need not be described in further detail. The embodiment for means 7 depicted in FIG. 6 uses a fiber optic differential delay loop, that is, a Mach-Zehnder interferometer, comprising segments 41 and 43 together with directional couplers 121 and 123. Coupler 121 sends a first portion of the beam through segment 41 while the second portion passes through segment 43. The two portions are recombined in coupler 123. Segments 41 and 43 should have different optical path lengths so that one portion is delayed with respect to the other portion before the two portions are recombined. The directional couplers may be fabricated in integrated form as, for example, on a $LiNbO_3$ chip or on glass. Implementations of Mach-Zehnder interferometers are well known to those skilled in the art and need not be described in more detail.

Figure 6:
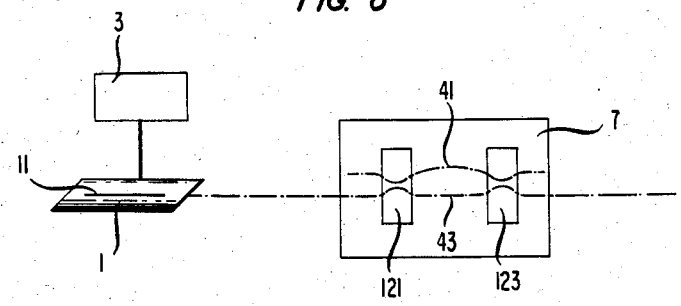

The embodiments depicted in FIG. 1 and FIG. 6 for means 7 appear to be slightly more advantageously employed than the other embodiments described. The preferred embodiments do not involve any reflections or recirculations of the beam so that the delay time is simply T and not the product of T and the finesse of the interferometer. It should additionally be noted that the preferred embodiments have two output ports which are complements of each other. This permits a feedback signal to be obtained without tapping off any additional light from the desired output beam.

Integrated optics embodiments of means 3 become more attractive than bulk optics embodiments as the frequency increases and the delay is reduced. Fabrication on a chip will then be preferred to the fiber optics embodiments as the relative delay is fixed and not dependent on a fiber which may move.

It should be noted that the intensity modulation scheme described has at least two advantages over direct current modulation. First, the amount of current being modulated is relatively small, typically less than 10 mA, and high modulation rates are more easily achieved. Second, only relatively small voltage changes are required. It should be noted that the required frequency modulation may be obtained with a voltage change of approximately 0.3 volts.

What is claimed is:
1. A direct intensity modulated light source comprising a single frequency laser;
   means for frequency modulating said laser to yield a frequency modulated output beam; and
   means for delaying a first portion of said output beam with respect to a second portion of said output beam and recombining said portions to produce intensity modulation.
2. A light source as recited in claim 1 in which said laser comprises a semiconductor laser diode.

3. A light source as recited in claim 2 in which said means for delaying causes said portions to travel two unequal optical path lengths.

4. A light source as recited in claim 3 in which said means for delaying comprises a Michelson interferometer.

5. A light source as recited in claim 3 in which said means for delaying comprises a Mach-Sehnder interferometer.

6. A light source as recited in claim 5 in which said interferometer comprises bulk optics.

7. A light source as recited in claim 5 in which said interferometer comprises integrated optics.

8. A light source as recited in claim 3 in which said means for delaying comprises a fiber optic recirculating loop.

9. A light source as recited in claim 3 further comprising a feedback stabilization circuit comprising means for monitoring portions of said outputs of said light source and said laser, and comparing said outputs; and means for adjusting the bias current to said laser.

* * * * *